US012597466B2

(12) United States Patent
Chang et al.

(10) Patent No.: US 12,597,466 B2
(45) Date of Patent: *Apr. 7, 2026

(54) SEMICONDUCTOR MEMORY DEVICES WITH DIFFERENTIAL THRESHOLD VOLTAGES

(71) Applicant: Taiwan Semiconductor Manufacturing Company, Ltd., Hsinchu (TW)

(72) Inventors: Meng-Sheng Chang, Chubei City (TW); Chia-En Huang, Xinfeng Township (TW); Yih Wang, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 153 days.

This patent is subject to a terminal disclaimer.

(21) Appl. No.: 18/628,284

(22) Filed: Apr. 5, 2024

(65) Prior Publication Data

US 2024/0274189 A1    Aug. 15, 2024

Related U.S. Application Data

(63) Continuation of application No. 17/497,175, filed on Oct. 8, 2021, now Pat. No. 11,978,509.
(Continued)

(51) Int. Cl.
*G11C 13/00* (2006.01)

(52) U.S. Cl.
CPC .......... *G11C 13/003* (2013.01); *G11C 13/004* (2013.01); *G11C 2213/74* (2013.01); *G11C 2213/79* (2013.01)

(58) Field of Classification Search
CPC . G11C 13/003; G11C 13/004; G11C 2213/74; G11C 2213/79; G11C 13/0069;
(Continued)

(56) References Cited

U.S. PATENT DOCUMENTS 7,453,716 B2 * 11/2008 Kim ................... G11C 13/0004
                                                             365/163
11,145,349 B1 * 10/2021 Pawlak ............... G11C 11/1659
(Continued)

FOREIGN PATENT DOCUMENTS

TW         201421471 A       6/2014

OTHER PUBLICATIONS

Non-Final Office Action on U.S. Appl. No. 17/497,175 Dtd Sep. 13, 2023.
(Continued)

*Primary Examiner* — Khamdan N. Alrobaie
(74) *Attorney, Agent, or Firm* — Foley & Lardner LLP

(57) ABSTRACT
A memory device includes at least a non-volatile memory cell. The non-volatile memory cell includes a resistor with a variable resistance, a first transistor, and a second transistor that are coupled in series. The first transistor has a first threshold voltage and the second transistor has a second threshold voltage that is different from the first threshold voltage. The first and the second transistors have their channels doped in respective different concentrations.

20 Claims, 5 Drawing Sheets

103

Related U.S. Application Data

(60) Provisional application No. 63/175,698, filed on Apr. 16, 2021.

(58) Field of Classification Search
CPC .............. G11C 17/165; G11C 2213/82; G11C 13/0007; G11C 13/0009
See application file for complete search history.

(56) References Cited

U.S. PATENT DOCUMENTS

| | | | | |
|---|---|---|---|---|
| 2011/0310684 | A1* | 12/2011 | Yamagami | H10D 84/217 |
| | | | | 365/194 |
| 2019/0355788 | A1 | 11/2019 | Chang et al. | |
| 2021/0064974 | A1 | 3/2021 | Kim et al. | |
| 2022/0020815 | A1 | 1/2022 | Dagan | |
| 2022/0351774 | A1* | 11/2022 | Chang | G11C 13/003 |
| 2023/0337419 | A1* | 10/2023 | Chang | H01L 23/5256 |

OTHER PUBLICATIONS

Notice of Allowance on U.S. Appl. No. 17/497,175 Dtd Jan. 10, 2024.
Office Action issued in Taiwan Appl. No. 111104197 dated Mar. 18, 2025.

* cited by examiner

SEMICONDUCTOR MEMORY DEVICES WITH DIFFERENTIAL THRESHOLD VOLTAGES

CROSS-REFERENCE TO RELATED APPLICATION

This application is a continuation application of U.S. Utility Application No. 17/497,175, filed Oct. 8, 2021, which claims priority to and the benefit of U.S. Provisional Application No. 63/175,698, filed Apr. 16, 2021, both of which are incorporated herein by reference in their entireties for all purposes.

BACKGROUND

Many modern-day electronic devices contain electronic memory configured to store data. Electronic memory may be volatile memory or non-volatile memory. Volatile memory stores data while it is powered, while non-volatile memory is able to store data when power is removed. A resistive random-access memory (RRAM) device is one promising candidate for next generation non-volatile memory technology due to its simple structure and Complementary Metal-Oxide-Semiconductor (CMOS) logic compatible process technology that is involved. In general, an RRAM device includes a number of RRAM cells. Each RRAM cell includes a dielectric data storage layer having a variable resistance, which is placed between two electrodes disposed within metallization layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
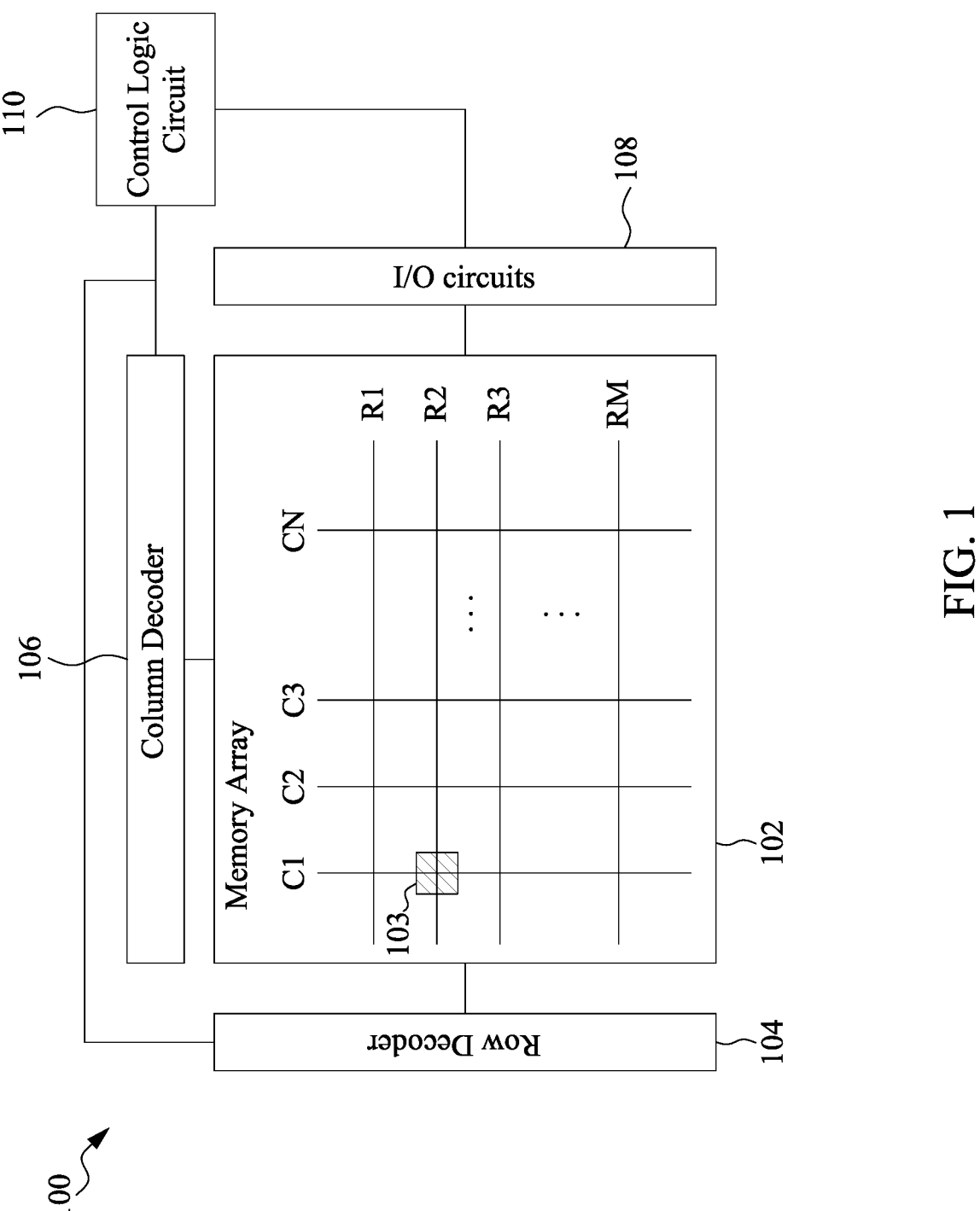
FIG. 1 illustrates a block diagram of an example memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random-access memory (RRAM) cells are non-volatile memory cells that store information by changes in electric resistance. In general, an RRAM cell includes a storage node in which a bottom electrode, a resistive switching layer and a top electrode may be sequentially stacked. The resistance of the resistive switching layer varies according to an applied voltage. An RRAM cell can be in a plurality of states in which the electric resistances are different. Each different state may represent a digital information. The state can be changed by applying a predetermined voltage or current between the electrodes, and each state may represent a different digital value. The RRAM cell may switch from one state to another by applying a predetermined voltage or current to the RRAM cell. For example, the RRAM cell has a state of relatively high resistance, referred to as "a high resistance state," and a state of relatively low resistance, referred to as "a low resistance state." The RRAM cell may be switched from the high resistance state to the low resistance state, or from the low resistance state to high resistance state by applying a predetermined voltage or current. The RRAM cell can be used in One-Time Programmable (OTP) applications, multiple-time programmable (MTP) applications, etc.

In the existing configurations of RRAM devices, each RRAM cell is typically constituted by an RRAM resistor and a transistor (sometimes referred to as a "one-transistor-one-resistor (1T1R)" configuration). The RRAM resistor may reversibly (in MTP applications) or irreversibly (in OTP applications) transition between a first resistance state and second resistance state, which correspond to a first logic state and second logic state, respectively. In general, such RRAM cells may be arranged as an array, for example, the RRAM cells arranged in a number of columns and a number of rows. To uniquely access (e.g., read) one of the cells, a first access line (e.g., a bit line (BL)), coupled to a group of cells including the to-be accessed cell, is asserted, and a second access line (e.g., a word line (WL)) gating a transistor of the to-be accessed cell is asserted. Accordingly, the to-be accessed cell is selected. A logic state of the selected cell can be read based on a current level flowing through the selected cell.

However, such 1T1R configurations may encounter various issues when the technology nodes continue to shrink. Although only the transistor of the selected cell is asserted (e.g., turned on), one or more of the transistors of unselected cells that are also coupled to the same BL may have leakage, even being turned off. Such leakage current can accumulate. When a level of the leakage current exceeds a certain threshold, the RRAM device can malfunction. For example, the logic state of a selected cell, which is supposedly to be read as logic 1 (when its resistance state is in a high state thereby conducting a low current level), will be misread as logic 0 because of the contribution of leakage current flowing through the unselected cells. Alternatively stated, the leakage current can alter a relatively low current level (corresponding to a first logic state) to a relatively high current level (corresponding to a second, different logic state). Thus, the current RRAM devices have not been entirely satisfactory in every aspect.

The present disclosures provides various embodiments of an RRAM device that includes a number of RRAM cells, each of which includes a resistor with a variable resistance values, a first transistor, and a second transistor coupled in series. Such a configuration may sometimes be referred to as a "two-transistors-one-resistor (2T1R)" configuration. Further, the first and second transistors are configured to have respective different threshold voltages, in various embodiments. For example, the first transistor, which is serially coupled between the RRAM resistor and the second transistor, may have a threshold voltage smaller than the second transistor. By including the second transistor with a higher threshold voltage than the first transistor for each cell, the voltage level present on a node commonly connecting to the first and second transistors of each unselected cell can be pulled up higher than a voltage level present on a gate terminal of the first transistor. With such a voltage difference across the first transistor for each of the unselected cells, leakage current flowing through the unselected cells can be significantly limited. Accordingly, various characteristics (e.g., read margins) of the disclosed RRAM device can be improved over the existing RRAM devices.

FIG. 1 illustrates a memory device 100, in accordance with various embodiments. In the illustrated embodiment of FIG. 1, the memory device 100 includes a memory array 102, a row decoder 104, a column decoder 106, an input/output (I/O) circuit 108, and a control logic circuit 110. Despite not being shown in FIG. 1, all of the components of the memory device 100 may be operatively coupled to each other and to the control logic circuit 112. Although, in the illustrated embodiment of FIG. 1, each component is shown as a separate block for the purpose of clear illustration, in some other embodiments, some or all of the components shown in FIG. 1 may be integrated together. For example, the memory array 102 may include an embedded I/O circuit 108.

The memory array 102 is a hardware component that stores data. In one aspect, the memory array 102 is embodied as a semiconductor memory device. The memory array 102 includes a plurality of memory cells (or otherwise storage units) 103. The memory array 102 includes a number of rows $R_1$, $R_2$, $R_3$. . . $R_M$, each extending in a first direction (e.g., X-direction) and a number of columns $C_1$, $C_2$, $C_3$. . . $C_N$, each extending in a second direction (e.g., Y-direction). Each of the rows/columns may include one or more conductive structures. In some embodiments, each memory cell 103 is arranged in the intersection of a corresponding row and a corresponding column, and can be operated according to voltages or currents through the respective conductive structures of the column and row.

In one aspect of the present disclosure, each memory cell 103 is implemented as an RRAM cell that includes an RRAM resistor with a variable resistance value, a first transistor, and a second transistor coupled in series. The first and second transistors can have respective different threshold voltages. Specifically, the first transistor serially coupled between the RRAM resistor and the second transistor has a lower threshold voltage than the second transistor. The first transistor and second transistor may sometimes be referred to as a "active transistor" and "footer transistor," respectively, in the following discussions. Although the present disclosure is directed to implementing the memory cell 103 as an RRAM cell, it should be understood that the memory cell 103 can include a ferroelectric random access memory (FeRAM) cell, a phase-change random access memory (PCRAM) cell, a magnetic tunnel junction random access memory (MTJ RAM) cell, a spin transfer torque magnetic random access memory (STT-MRAM) cell, etc., while remaining within the scope of present disclosure.

For each RRAM cell, the first and second transistors can be concurrently turned on/off to enable/disable an access (e.g., program, read) to the corresponding RRAM resistor. For example, upon being selected, the first and second transistors of the selected RRAM cell can be turned on so as to generate a program or read path conducting through its RRAM resistor and those two transistors. Further, with the footer transistors having a relatively large threshold voltage, the active transistors of those unselected RRAM cells can remain turned-off as the voltage on a source terminal of the active transistor (if implemented as an n-type transistor) can be pulled higher than the voltage on a gate terminal of the active transistor, which can advantageously assure a read margin of the selected RRAM to remain optimally wide. Detailed descriptions on configurations of the memory cell 103 will be discussed below with respect to FIG. 2.

The row decoder 104 is a hardware component that can receive a row address of the memory array 102 and assert a conductive structure (e.g., a word line) at that row address. The column decoder 106 is a hardware component that can receive a column address of the memory array 102 and assert one or more conductive structures (e.g., a bit line, a source line) at that column address. The I/O circuit 108 is a hardware component that can access (e.g., read, program) each of the memory cells 103 asserted through the row decoder 104 and column decoder 106. The control logic circuit 110 is a hardware component that can control the coupled components (e.g., 102 through 108). Detailed descriptions on operations of memory device 100 are provided below with respect to FIG. 4.

Figure 2:
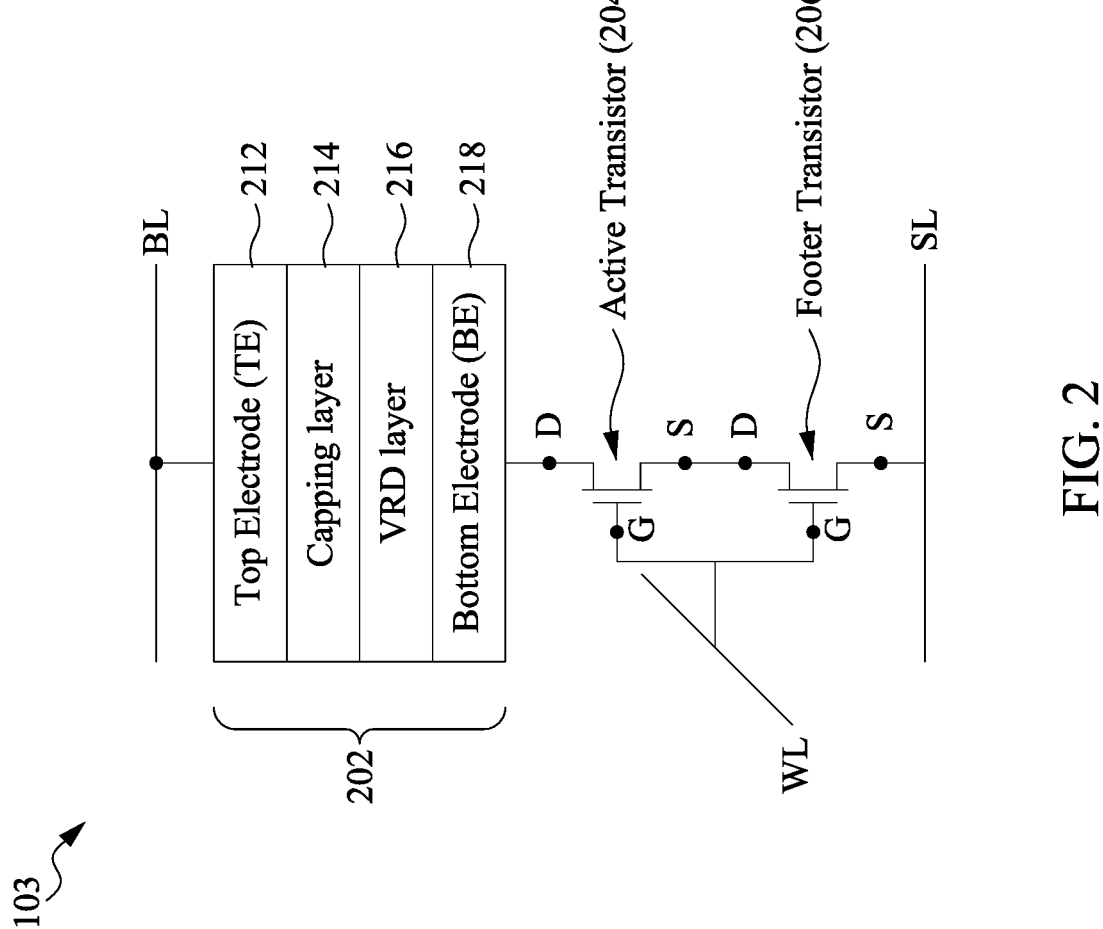
FIG. 2 illustrates a circuit diagram of a memory cell of the memory device of FIG. 1, in accordance with some embodiments.

FIG. 2 illustrates an example configuration of the RRAM cell 103 (FIG. 1), in accordance with some embodiments. The RRAM cell 103 is implemented as a 2T1R RRAM configuration, for example, a resistor 202 with a variable resistance value (sometimes referred to as an "RRAM resistor") is serially connected to an active transistor 204 and then a footer transistor 206. Specifically, the active transistor 204 and footer transistor 206 have respective threshold voltages ($V_{tha}$ and $V_{thf}$), wherein $V_{thf}$ is greater than $V_{tha}$, in accordance with various embodiments of the present disclosure. It, however, should be understood that any of various other RRAM configurations that exhibit the characteristic of variable resistance and multi-threshold voltages may be used by the RRAM cell 103 such as, for example, a 2-diodes-1 resistor (2D1R) configuration, a many-transistors-one-resistor (many T1R) configuration, etc., while remaining within the scope of the present disclosure.

The resistor 202 is formed as a multi-layer stack that includes a top electrode (TE) 212, a capping layer 214, a variable resistance dielectric (VRD) layer 216, and a bottom electrode (BE) 218. The TE 212 may be formed from at least one of the materials selected from: Pt, TiN/Ti, TiN, Ru, Ni, and combinations thereof; the capping layer 214 may be formed from at least one of the transition metal materials such as, Ti, Ni, Hf, Nb, Co, Fe, Cu, V, Ta, W, Cr, and combinations thereof; the VRD layer 216 may be formed from at least one of the transition metal oxide materials such as, TiOx, NiOx, HfOx, NbOx, CoOx, FeOx, CuOx, VOx, TaOx, WOx, CrOx, and combinations thereof; and the BE 218 may be formed of at least one of the materials selected from: TiN, TaN, W, Pt, and combinations thereof. In some embodiments, the VRD layer 216 may include a high-k dielectric layer. In general, the VRD layer 216 may be formed by deposition, for example, atomic layer deposition (ALD), chemical vapor deposition (CVD), meta-organic chemical vapor deposition (MOCVD), etc., to have a particular thickness and crystalline structure using a particular manufacturing process recipe.

The active transistor 204 and footer transistor 206 each include an n-type transistor, while the active transistor 204 and footer transistor 206 can each be implemented as a p-type transistor (which will be discussed below). In various embodiments, a drain terminal of the active transistor 204 is connected to the BE 218, a gate terminal of the active transistor 204 is connected to a word line (WL), a source terminal of the active transistor 204 is connected to a drain terminal of the footer transistor 206, a gate terminal of the footer transistor 206 is also connected to the same WL, and a source terminal of the footer transistor 206 is connected to a source line (SL). The WL is configured to receive a control signal from the I/O circuit 108 (FIG. 1) to enable the access to a selected RRAM cell. The SL may be connected to ground when the transistors 204 and 206 are implemented as n-type transistors; and the SL may be connected to VDD when the transistors 204 and 206 are implemented a p-type transistors. Further, the TE 212 is coupled to a bit line (BL) configured to receive various voltage signals (e.g., a read voltage signal, a program voltage signal, which will be discussed below) from the I/O circuit 108 (FIG. 1).

In some embodiments, the active transistor 204 and footer transistor 206 have respective different threshold voltages, $V_{tha}$ and $V_{thf}$, where $V_{tha}$ is less than $V_{thf}$. In an example, the active transistor 204 may be formed as a core transistor, while the footer transistor 206 may be formed as an I/O transistor. Specifically, the active transistor 204 and footer transistor 206 may be formed in a first (core) area and a second (I/O) area of a substrate, respectively, where the first area has a higher transistor density than the second area. More specifically, the transistors in the first area (including the active transistor 204) may be formed of having a relatively thin (e.g., high-k) gate dielectric layer, when compared with the transistors in the second area (including the footer transistor 206) that are formed of having a relatively thick (e.g., high-k) gate dielectric layer.

In another example, a gate structure of the active transistor 204 and a gate structure of the footer transistor 206 may have different work function metals or different work function metal combinations. For instance, the gate structure of the active transistor 204 may have a first combination of metals selected from the group consisting of: Ti, Ag, TaAl, TaAlC, TiAlN, TaC, TaCN, TaSiN, Mn, Zr, TiN, TaN, Ru, Mo, Al, $ZrSi_2$, $MoSi_2$, $TaSi_2$, $NiSi_2$, and WN. And, the gate structure of the footer transistor 206 may have a second, different combination selected from the same metal group, that can cause the active transistor 204 to have a lower threshold voltage than the footer transistor 206. In yet another example, a channel (e.g., a fin, nanosheets) of the active transistor 204 and a channel of the footer transistor 206 (e.g., a fin, nanosheets) may have respective different doping concentrations. For instance, the channel of the n-type active transistor 204 may have a doping concentration lower than the channel of the n-type footer transistor 206. However, it should be noted that, in some other embodiments, the active transistor 204 and footer transistor 206 may have similar threshold voltages, while remaining within the scope of present disclosure.

In some embodiments, each of the RRAM cells of the memory array 102 is configured to switch between a high resistance state (HRS) and a low resistance state (LRS). For example, when the RRAM cell 103 is in the HRS, the RRAM cell 103 (or its RRAM resistor) may present a resistance value, which ranges between about 10 and about 100 kilo ohm; and when the RRAM cell 103 is in the LRS, the RRAM cell 103 (or its RRAM resistor) may present a resistance value, which ranges between about 10 and about 20 kilo ohm. Accordingly, when the RRAM cell 103 is in the HRS state, the RRAM cell 103 can conduct a relatively low level of current; and when the RRAM cell 103 is in the LRS state, the RRAM cell 103 can conduct a relatively high level of current. It should be noted that the transition between the HRS and LRS may be irreversible or reversible depending on a magnitude of the program voltage. With the reversible transition, the RRAM cell 103 (as fabricated) may present an HRS, and upon being programmed, the RRAM cell 103 can switch to an LRS. With the irreversible transition, the RRAM cell 103 may function as a one-time-programmable memory cell (e.g., an electrical fuse (efuse)). As fabricated, such an efuse cell 103 may present a LRS (or short circuit) and may irreversibly switch to a HRS (or open circuit) after being programmed.

Figure 3:
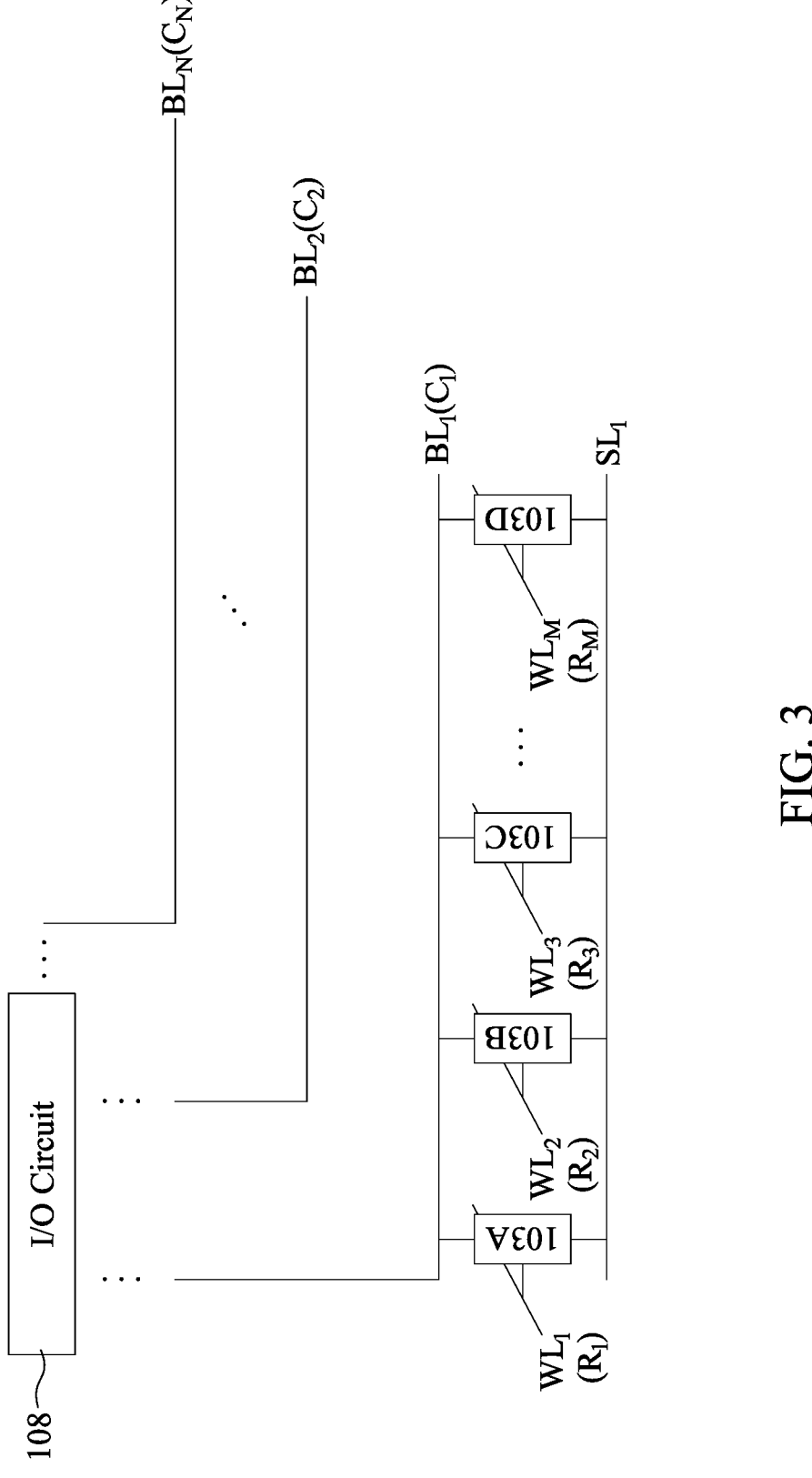
FIG. 3 illustrates a circuit diagram of a memory array of the memory device of FIG. 1, in accordance with some embodiments.

FIG. 3 illustrates an example circuit diagram of a portion of the memory device 100 (FIG. 1), in accordance with various embodiments. In the illustrated example of FIG. 3, four RRAM cells, 103A, 103B, 103C, and 103D, of the memory array 102 are shown. Each of the cells 103A-D is substantially similar to the RRAM cell 103 discussed with respect to FIG. 2. Although four RRAM cells are shown, it should be appreciated that the memory array 102 can have any number of RRAM cells, while remaining within the scope of present disclosure.

As mentioned above with respect to FIG. 1, the RRAM cells 103 of the memory array 102 are formed as an array, in which the RRAM cells are arranged over a number of columns and a number of rows. For example, a subset of the RRAM cells are arranged along one of the rows, and each of the subset of RRAM cells is arranged along a respective column. Alternatively stated, each of the RRAM cells is arranged at the intersection of a column and a row. As shown in the example of FIG. 3, the RRAM cell 103A is arranged at the intersection of column $C_1$ and row $R_1$; the RRAM cell 103B is arranged at the intersection of column $C_1$ and row $R_2$; the RRAM cell 103C is arranged at the intersection of column $C_1$ and row $R_3$; and the RRAM cell 103D is arranged at the intersection of column $C_1$ and row $R_M$. The column $C_1$ includes a first bit line $BL_1$ and a first source line $SL_1$, while the other columns ($C_2 \ldots C_N$) each include its respective BL ($BL_2$, $BL_N$) and SL (not shown). The row $R_1$ includes a word line $WL_1$; the row $R_2$ includes a word line $WL_2$; the row $R_3$ includes a word line $WL_3$; and the row $R_M$ includes a word line $WL_M$.

It should be noted that the bit lines and source lines are not necessarily disposed in the column of a memory array, neither are the word lines disposed in the row of a memory array. For example, in some other embodiments, the bit line and source line may be disposed along a corresponding one of a number of rows of a memory array and the word line may be disposed along a corresponding one of a number of columns of the same memory array, while remaining within the scope of present disclosure.

Referring still to FIG. 3, each of the RRAM cells 103 is operatively coupled to the I/O circuit 108 through a corresponding one of the BLs. In various embodiments, the I/O circuit 108 includes at least a program circuit and a read circuit that can respectively program and read each of the RRAM cells 103 through the respective BL, which will be discussed in FIG. 4 as follows. In the following discussions, the RRAM cells 103 are each configured as an efuse, i.e., the RRAM cell 103 being fabricated as a short circuit (in the LRS) and programmed to be an open circuit (in the HRS).

Figure 4:
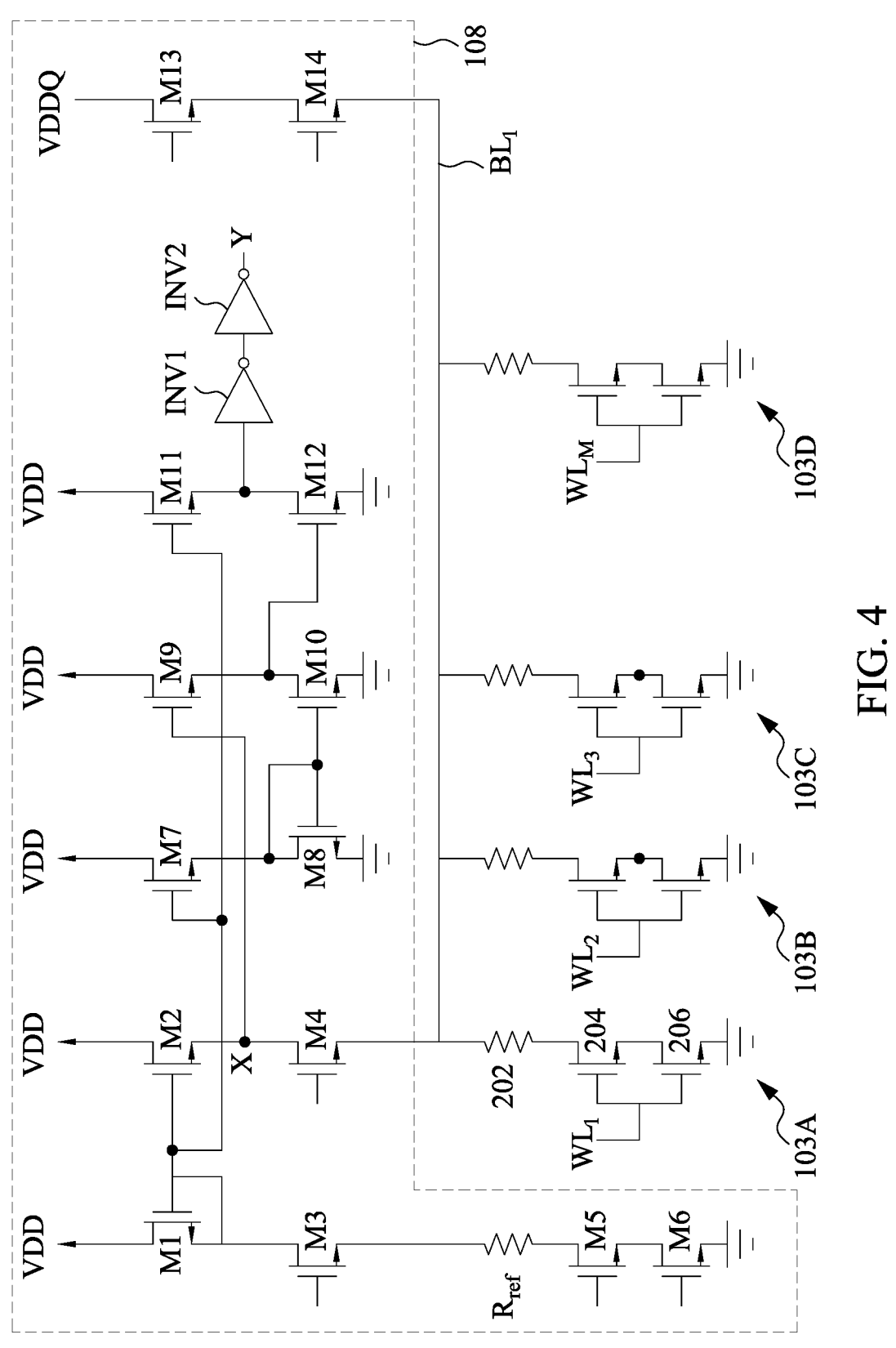
FIG. 4 illustrates a circuit diagram of an input/output (I/O) circuit of the memory device of FIG. 1, in accordance with some embodiments.

FIG. 4 illustrates an example circuit diagram of the I/O circuit 108 coupled to the RRAM cells 103A-D through $BL_1$, in accordance with various embodiments. It should be understood that the circuit diagram of the I/O circuit 108 shown in FIG. 4 is simplified for illustration purposes, and thus, the I/O circuit 108 can include any of various other components, while remaining within the scope of present disclosure.

As shown in FIG. 4, the I/O circuit 108 includes a number of transistors, M1, M2, M3, M4, M5, M6, M7, M8, M9, M10, M11, M12, M13, and M14; a reference resistor, Rref; and inverters, INV1 and INV2. Most of the transistors of the I/O circuit 108 may be operated under supply voltages, VDD and ground. In some embodiments, the transistors M1, M2, M7, M9, M11, M13, and M14 may each be implemented as a p-type transistor; and the transistors M3, M4, M5, M6, M8, M10, and M12 may each be implemented as an n-type transistor. Further, the transistors M13 and M14 may function at least as a portion of a program circuit configured to program a selected one of the RRAM cells 103A-D; and the transistors M1 to M6 may function at least as a portion of a read circuit to read a selected one of the RRAM cells 103A-D, with the transistors M7 to M12 being optional.

To program a selected one of the RRAM cells 103A-D (e.g., 103A), $BL_1$ is asserted and $WL_1$ is asserted, while the rest of the WLs are deasserted. The transistor M4 is turned off (e.g., by applying a logic low signal to its gate terminal), thereby disconnecting the read circuit from the RRAM cells along $BL_1$. On the other hand, the transistors M13 and M14 are turned on (e.g., by applying a logic low signal to their gate terminals), thereby connecting the program circuit to the RRAM cells along $BL_1$. Upon being turned on, the transistors M13 and M14 (the program circuit) can propagate a program voltage, VDDQ, to the selected RRAM cell 103A through $BL_1$, while not propagating the program voltage to the unselected RRAM cells, e.g., 103B-D. As a non-limiting example, when in this program mode, the program voltage, VDDQ, may be about 1.8 volts (V), $WL_1$ may be asserted with a similar level of voltage signal, 1.8V, and the rest of WLs may be deasserted with a voltage level of about 0V.

To read a selected one of the RRAM cells 103A-D (e.g., 103A), $BL_1$ is asserted and $WL_1$ is asserted, while the rest of the WLs are deasserted. The transistor M4 is turned on (e.g., by applying a logic high signal to its gate terminal), thereby connecting the read circuit to the RRAM cells along $BL_1$. On the other hand, the transistors M13 and M14 are turned off (e.g., by applying a logic high signal to their gate terminals), thereby disconnecting the program circuit from the RRAM cells along $BL_1$. When the transistor M4 is turned on, the transistors M3, M5, and M6 are turned on. The reference resistor Rref can function as a reference to be compared with a resistance value of the selected RRAM cell, thereby allowing the inverters INV1 and INV2 to output a logic state at node Y.

For example, if the resistor of the selected RRAM cell 103A is in a LRS (e.g., not programmed yet), a current conducting through the reference resistor Rref can be mirrored from a first current path, flowing through the transistor M1 to ground, to a second current path, flowing through the transistors M2 and M4, the selected RRAM cell 103A, and to ground. As such, a voltage level at node X is pulled down to ground, which can turn on the transistor M9 to propagate VDD (a logic high state) to a gate terminal of the transistor M12. The transistor M12 is turned on. Next, an input of the inverter INV1 can be pulled down to ground (a logic low state) through the turned-on transistor M12. Thus, the inverter INV2 can output a logic low state at node Y.

If the resistor of the selected RRAM cell 103A is in a HRS (e.g., already programmed), a current conducting through the reference resistor Rref can be mirrored from a first current path, flowing through the transistor M1 to ground, to a second current path, flowing through the transistors M2 and M4, but not to ground as the resistor of the RRAM cell 103A presents an open circuit. As such, a voltage level at node X cannot be pulled down to ground. Instead, the voltage level at node X may remain at about VDD through the transistor M2, i.e., $VDD-V_{th}$ (a threshold voltage of the transistor M2), which can turn off the transistor M9. The turned-off transistor M9 can cause the transistor M12 to be turned off. Referring again the transistor M2, as its drain terminal (node X) is pulled up to about $VDD-V_{th}$, its gate terminal may present a similar voltage level, $VDD-V_{th}$, which in turn can turn on the transistor M11 such that VDD (a logic high state) is propagated to the input of the inverter INV1 through the turned-on transistor M11. Thus, the inverter INV2 can output a logic high state at node Y.

As a non-limiting example, when in this read mode, the program voltage, VDDQ, may remain at about 1.8 V, but the transistors M13 and M14 are turned off. $WL_1$ may be asserted with a voltage level at about 0.75V that corresponds to a logic high state, and the rest of WLs may be deasserted with a voltage level of about 0V that corresponds to a logic low state. With the logic high state applied on the gate terminals of the active transistor 204 and footer transistor 206 of the selected RRAM cell 103A, the logic state of the RRAM cell 103A (depending on whether or not the resistor 202 is programmed) can be read out, as discussed above. On the other hand, the gate terminals of the active transistor and footer transistor of each of the unselected cells (e.g., 103B-D) are applied with a signal of about 0V.

According to various embodiments of present disclosure, with the footer transistor serially coupled between ground and the active transistor, a voltage level at the common node (node Z) connecting to the active transistor and footer transistor of the unselected cells can be pulled up higher than ground (e.g., 0.1V). For example, a voltage drop across the source and drain terminals of the footer transistor (e.g., the voltage level at node Z when the source terminal is connected to ground) is positively proportional to the threshold voltage of the footer transistor. A voltage level present on the source terminal of the active transistor (i.e., node Z) can thus be pulled up as a non-zero voltage, which causes the active transistor to have a negative Vgs. Accordingly, the active transistor of each of the unselected RRAM cells can be assured to remain off, i.e., attributing significantly low leakage current.

Figure 5:
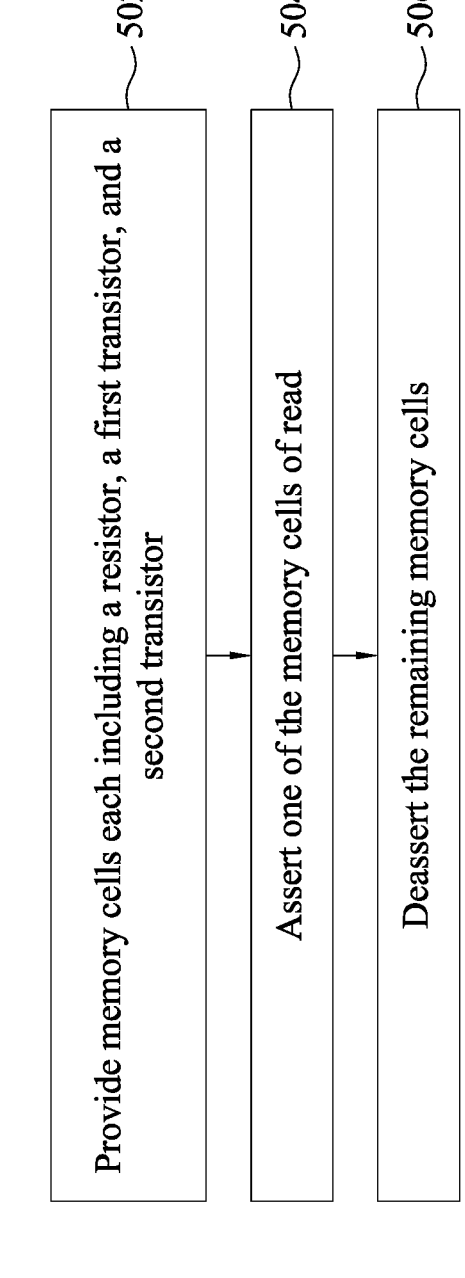
FIG. 5 illustrates a flow chart of a method to access the memory device of FIG. 1, in accordance with some embodiments.

FIG. 5 illustrates a flow chart of an example method 500 of operating (e.g., reading) an example memory device including a number of the currently disclosed memory cells (e.g., 103), in accordance with some embodiments. It should be noted that the method 500 is merely an example and is not intended to limit the present disclosure. Accordingly, it is understood that additional steps or operations may be provided before, during, and after the method 500 of FIG. 5, and that some other operations may only be briefly described herein.

In brief overview, the method 500 starts with operation 502 of providing a number of memory cells, each of the memory cells including a resistor, a first transistor, and a second transistor coupled in series. Next, the method 500 proceeds to operation 504 of asserting one of the memory cells to read. The method 500 then proceeds to operation 506 of deasserting the remaining ones of the memory cells. In various embodiments, while reading the asserted memory cell, nodes connected between the first and second transistor of each of the remaining memory cells have a voltage level greater than zero.

In operation 502, a number of memory cells, each of which includes a resistor, a first transistor, and a second transistor coupled in series, are provided. For example, each of the memory cells (e.g., 103) includes a resistor (e.g., RRAM resistor 202) with a variable resistance, a first transistor (e.g., active transistor 204) serially connecting to one end of the resistor, and a second transistor (e.g., footer transistor 206) serially connecting to the first transistor. Further, the memory cells are arranged as an array, with a number of bit lines (BLs), a number of source lines (SLs), and a number of word lines (WLs) intersected with one another at a corresponding one of the memory cells. For example, the other end of the resistor of each memory cell is connected to a corresponding one of the BLs, gate terminals of the first and second transistors of each memory cell are connected to a corresponding one of the WLs, and a source terminal of the second transistor of each memory cell is connected to a corresponding one of the SLs.

In various embodiments, the first transistor and second transistor may have respective different threshold voltages, in which the second transistor (the footer transistor) has a higher threshold voltage than the first transistor (the active transistor). For example, the second transistor can have a thicker gate dielectric layer than the first transistor. In another example, the second transistor can have a gate structure constituted by one or more work function metals that are characterized with a higher threshold voltage than the first transistor. In some other embodiments, the first transistor and second transistor may have similar threshold voltages, while remaining within the scope of present disclosure.

In operation 504 and 506, one of the memory cells is asserted to be read, and the other memory cells are deasserted from being accessed. The operations 504 and 506 may be performed concurrently. In some embodiments, the operation 504 includes at least asserting one of the WLs that gates the first and second transistors of the asserted memory cell (e.g., by applying signal with a logic high state on that WL, if the transistors are n-type); and the operation 506 includes at least deasserting remaining ones of the WLs that gate the respective first and second transistors of remaining ones of the memory cells (e.g., by applying signal with a logic low state on those WLs, if the transistors are n-type).

In the embodiments where the first and second transistors of the memory cells are implemented as n-type transistors, the SLs are typically connected to ground. In various embodiments of present disclosure, with the second transistor serially coupled between ground and the first transistor, a voltage level at the common node connected between the first transistor and second transistor of each of the deasserted cells can be pulled up higher than a voltage level present of the gate terminal of the first transistor (a logic low state, e.g., 0V). As a result, a negative Vgs is present on the first transistor. Accordingly, the first transistor of each of the deasserted cells can be assured to remain off, i.e., attributing significantly low leakage current when reading the asserted cell.

In one aspect of the present disclosure, a memory device is disclosed. The memory device includes a non-volatile memory cell. The non-volatile memory cell includes a resistor with a variable resistance, a first transistor, and a second transistor that are coupled in series. The first transistor has a first threshold voltage and the second transistor has a second threshold voltage, the first threshold voltage being different from the second threshold voltage.

In another aspect of the present disclosure, a memory device is disclosed. The memory device includes a plurality of resistive random-access memory (RRAM) cells commonly connected between a bit line (BL) and a source line (SL). Each of the RRAM cells includes a resistor, a first transistor, and a second transistor coupled to each other in series, with the resistor connected to the BL and the second transistor connected to the SL. The first transistor has a first threshold voltage and the second transistor has a second threshold voltage, the first threshold voltage being less than the second threshold voltage.

In yet another aspect of the present disclosure, a method for accessing a memory device is disclosed. The method includes providing a plurality of memory cells coupled between a bit line (BL) and a source line (SL). Each of the plurality of memory cells comprises a resistor operatively coupled to the BL, a first transistor connected to the resistor in series, and a second transistor connected to the first transistor in series and operatively coupled to the SL. The method includes reading one of the plurality of memory cells by at least performing: (i) asserting one of a plurality of word lines (WLs) that gates the first and second transistors of the memory cell; and (ii) deasserting remaining ones of the plurality of WLs that gate the respective first and second transistors of remaining ones of the plurality of memory cells. Respective nodes connected between the first and second transistor of each of the remaining memory cells have a voltage level greater than zero.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a non-volatile memory cell;
   wherein the non-volatile memory cell includes a resistor with a variable resistance, a first transistor, and a second transistor that are coupled in series;
   wherein the first transistor has a first threshold voltage and the second transistor has a second threshold voltage that is different from the first threshold voltage; and wherein the first and the second transistors have their channels doped in respective different concentrations.

2. The memory device of claim 1, wherein the first transistor and the second transistor have different high-k gate dielectric layers and the second threshold voltage is greater than the first threshold voltage.

3. The memory device of claim 1, wherein the non-volatile memory cell is coupled between a bit line (BL) and a source line (SL).

4. The memory device of claim 3, wherein the resistor has a first terminal connected to the BL and a second terminal connected to a first source/drain terminal of the first transistor, the first transistor has a second source/drain terminal connected to a first source/drain terminal of the second transistor, and the second transistor has a second source/drain terminal connected to the SL.

5. The memory device of claim 1, wherein a first gate terminal of the first transistor and a second gate terminal of the second transistor are commonly coupled to a word line (WL).

6. The memory device of claim 5, wherein the second transistor is configured to provide a negative Vgs for the first transistor, in response to the WL being not asserted.

7. The memory device of claim 1, wherein the second threshold voltage is greater than the first threshold voltage.

8. The memory device of claim 1, wherein the first and second transistors are both n-type transistors.

9. The memory device of claim 1, wherein the first and second transistors are both p-type transistors.

10. The memory device of claim 1, wherein the first and second transistors have respective different work function layers.

11. A memory device, comprising:
a plurality of resistive memory cells commonly connected between a bit line (BL) and a source line (SL);
wherein each of the resistive memory cells includes a resistor, a first transistor, and a second transistor coupled to each other in series, with the resistor connected to the BL and the second transistor connected to the SL; and
wherein the first transistor and the second transistor have different work function layers.

12. The memory device of claim 11, wherein each of the plurality of memory cells is a random-access memory (RRAM) cell.

13. The memory device of claim 11, wherein the first transistor has a first threshold voltage and the second transistor has a second threshold voltage, the first threshold voltage being less than the second threshold voltage.

14. The memory device of claim 11, wherein a first gate terminal of the first transistor and a second gate terminal of the second transistor are commonly coupled to a word line (WL).

15. The memory device of claim 11, wherein the second transistor of each unselected one of the plurality of memory cells is configured to increase a voltage level at a node connected between the first and the second transistors of the unselected RRAM cell.

16. The memory device of claim 15, wherein the voltage level is greater than zero.

17. The memory device of claim 11, wherein the first and the second transistors have respective different high-k gate dielectric layers.

18. A method for accessing a memory device, comprising:
providing a plurality of memory cells coupled between a bit line (BL) and a source line (SL), wherein each of the plurality of memory cells comprises a resistor operatively coupled to the BL, a first transistor connected to the resistor in series, and a second transistor connected to the first transistor in series and operatively coupled to the SL; and
reading one of the plurality of memory cells includes asserting one of a plurality of word lines (WLs) that gates the first and second transistors of the memory cell.

19. The method of claim 18, wherein the reading the one of the plurality of memory cells also includes deasserting remaining ones of the plurality of WLs that gate the respective first and second transistors of remaining ones of the plurality of memory cells.

20. The method of claim 18, wherein respective nodes connected between the first and the second transistor of each of the remaining memory cells have a voltage level greater than zero.

* * * * *